United States Patent
Tatebayashi et al.

(10) Patent No.: US 7,612,561 B2
(45) Date of Patent: Nov. 3, 2009

(54) MAGNETIC RESONANCE DIAGNOSING APPARATUS AND ITS OPERATING METHOD

(75) Inventors: Isao Tatebayashi, Utsunomiya (JP); Kiyomi Ooshima, Nasushiobara (JP); Masaaki Umeda, Sakura (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 95 days.

(21) Appl. No.: 11/889,115

(22) Filed: Aug. 9, 2007

(65) Prior Publication Data

US 2008/0036458 A1    Feb. 14, 2008

(30) Foreign Application Priority Data

Aug. 11, 2006    (JP) .............................. 2006-220333

(51) Int. Cl.
*G01V 3/00*    (2006.01)
(52) U.S. Cl. ........................ 324/318; 324/309
(58) Field of Classification Search ......... 324/300–322; 600/407–445
See application file for complete search history.

(56) References Cited

U.S. PATENT DOCUMENTS

| 5,371,778 | A | * | 12/1994 | Yanof et al. ..................... 378/4 |
| 5,545,993 | A | * | 8/1996 | Taguchi et al. ............... 324/309 |
| 5,560,360 | A | * | 10/1996 | Filler et al. .................. 600/408 |
| 5,631,560 | A | * | 5/1997 | Machida ...................... 324/309 |
| 6,002,254 | A | * | 12/1999 | Kassai et al. ................ 324/306 |
| 6,196,715 | B1 | * | 3/2001 | Nambu et al. ............... 378/197 |
| 7,403,004 | B2 | * | 7/2008 | Morich et al. ............... 324/309 |
| 7,457,657 | B2 | * | 11/2008 | Harder, Martin ............ 600/420 |
| 2005/0267352 | A1 | * | 12/2005 | Biglieri et al. .............. 600/410 |
| 2006/0241379 | A1 | * | 10/2006 | Greiser et al. ............... 600/410 |
| 2007/0208248 | A1 | * | 9/2007 | Harvey et al. ............... 600/410 |
| 2008/0180104 | A1 | * | 7/2008 | Furudate ..................... 324/318 |

FOREIGN PATENT DOCUMENTS

| JP | 3-264049 | 11/1991 |
| JP | 7-255693 | 10/1995 |
| JP | 8-191816 | 7/1996 |
| JP | 2001-187038 | 7/2001 |

OTHER PUBLICATIONS

Chinese Office Action dated Feb. 27, 2009, re CN 200710140891.0, including English translation.

* cited by examiner

*Primary Examiner*—Brij B Shrivastav
(74) *Attorney, Agent, or Firm*—Nixon & Vanderhye PC

(57) ABSTRACT

A magnetic resonance diagnosing apparatus includes a generating unit which generates a plurality of slice images of a object for an imaging region, a determining unit which determines a plurality of slice regions for spectroscopy within the imaging region, and a measurement unit which measures a magnetic resonance spectrum of the object for each of voxels set on the plurality of determined slice regions.

12 Claims, 6 Drawing Sheets

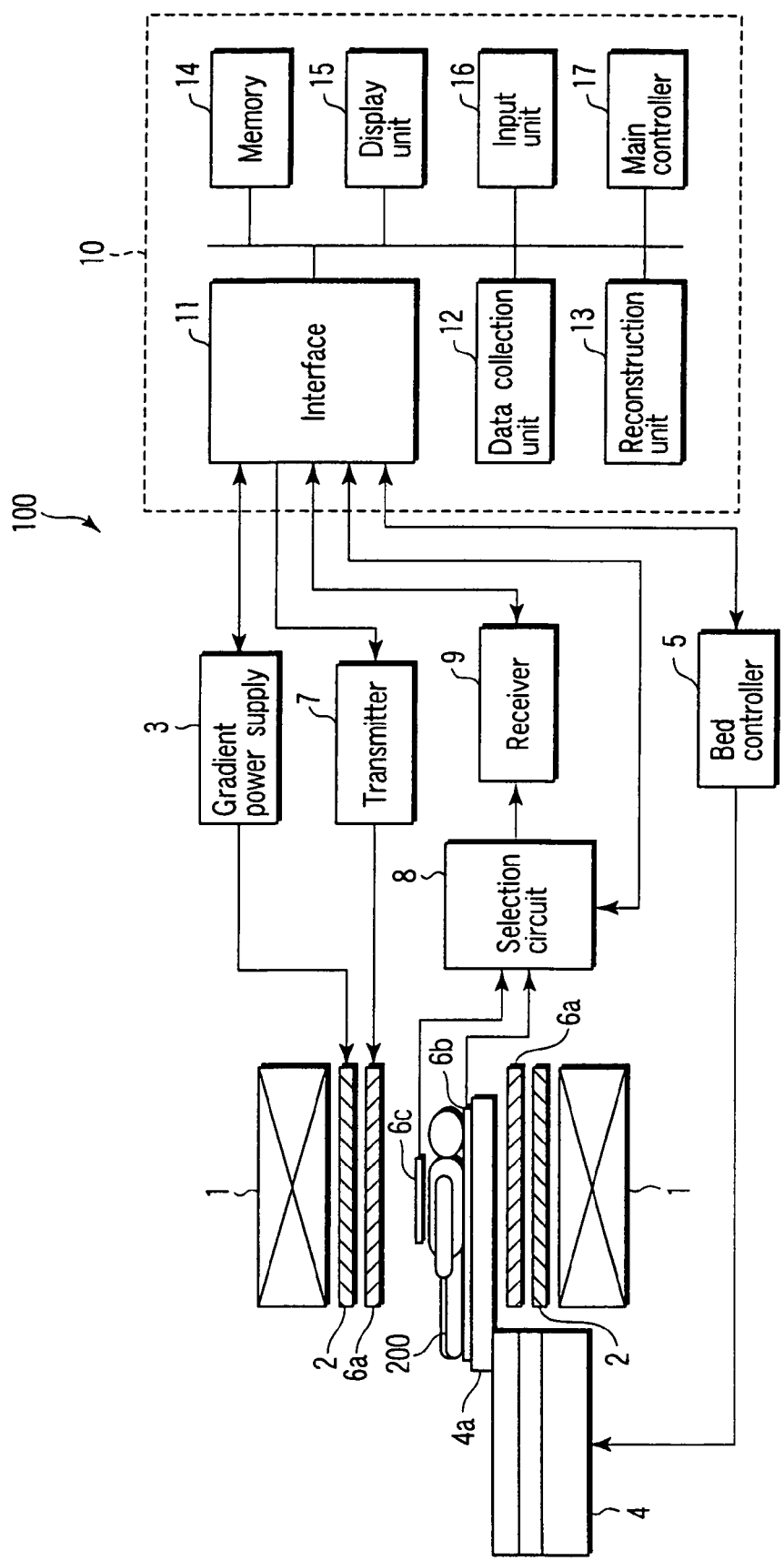
F I G. 1

MAGNETIC RESONANCE DIAGNOSING APPARATUS AND ITS OPERATING METHOD

CROSS-REFERENCE TO RELATED APPLICATIONS

This application is based upon and claims the benefit of priority from prior Japanese Patent Application No. 2006-220333, filed Aug. 11, 2006, the entire contents of which are incorporated herein by reference.

BACKGROUND OF THE INVENTION

1. Field of the Invention

The present invention relates to a magnetic resonance diagnosing apparatus that performs the magnetic resonance imaging (MRI) and the magnetic resonance spectroscopy (MRS), and its operating method.

2. Description of the Related Art

An apparatus of this type is known as disclosed in, for example, Jpn. Pat. Appln. KOKAI Publication No. 2001-187038.

The apparatus of this type is designed such that the user is able to designate a location to be measured by the MRS while monitoring the image obtained by the MRI. Therefore, as long as the region of slicing which corresponds to one sliced image is set to the region to be measured by the MRS, a sliced image and its MRS measurement result are associated with each other, and therefore the diagnosis can be performed while monitoring both of them.

However, there is recently a great demand for three-dimensional spectroscopy measurement based on the magnetic resonance signals collected by multi slice. In the case where such spectroscopy measurement is carried out, it is effective to perform multi slice imaging in the MRI as well. However, the spectroscopy measurement and the multi slice imaging are performed separately.

With this operation, in some cases, there is no slice image at a slice location within a slice region where the spectroscopy measurement was carried out. In such case, the diagnosis cannot be carried out while monitoring the slice image and the MRS measurement result at the same time.

BRIEF SUMMARY OF THE INVENTION

Under these circumstances, there has been a demand for such a technique that there is always a slice image at a slice location corresponding to a slice region where the magnetic resonance spectroscopy was carried out.

According to a first aspect of the present invention, there is provided a magnetic resonance diagnosing apparatus comprising: a generating unit which generates a plurality of slice images of an object for an imaging region; a determining unit which determines a plurality of slice regions for spectroscopy within the imaging region; and a measurement unit which measures a magnetic resonance spectrum of the object for each of voxels set on the plurality of determined slice regions.

According to a second aspect of the present invention, there is provided a magnetic resonance diagnosing apparatus comprising: a determining unit which determines a plurality of slice regions for spectroscopy; a measurement unit which measures a magnetic resonance spectrum of an object for each of voxels set on the plurality of determined slice regions; and a generating unit which generates slice images of the object with regard to each of a plurality of slice positions that coincide with positions of the voxels set on the plurality of slice regions.

According to a third aspect of the present invention, there is provided a method of operating a magnetic resonance diagnosing apparatus comprising: generating a plurality of slice images of an object for an imaging region; determining a plurality of slice regions for spectroscopy within the imaging region; and measuring a magnetic resonance spectrum of the object for each of voxels set on the plurality of determined slice regions.

According to a fourth aspect of the present invention, there is provided a method of operating a magnetic resonance diagnosing apparatus comprising: determining a plurality of slice regions for spectroscopy; measuring a magnetic resonance spectrum of an object for each of voxels set on the plurality of determined slice regions; and generating slice images of the object with regard to each of a plurality of slice positions that coincide with positions of the voxels set on the plurality of slice regions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a diagram showing the structure of a magnetic resonance diagnosing apparatus according to the first to third embodiments of the present invention;

DETAILED DESCRIPTION OF THE INVENTION

Figure 2:
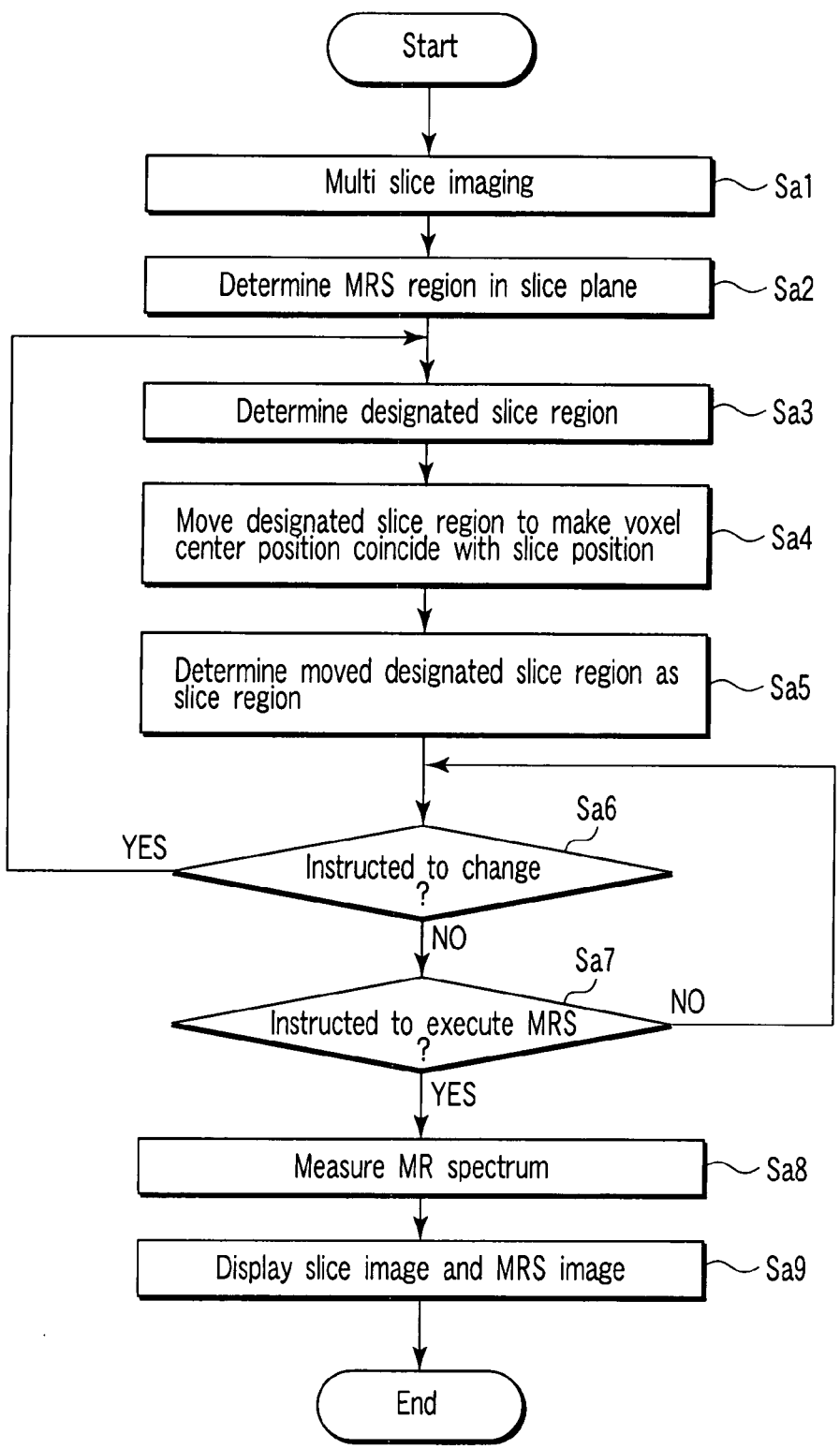
FIG. 2 is a flowchart illustrating the processing steps of a main controller shown in FIG. 1 in the first embodiment.

The first to third embodiments of the present invention will now described with reference to accompanying drawings.

FIG. 1 shows the structure of a magnetic resonance diagnosing apparatus 100 according to each of the first to third embodiments. The magnetic resonance diagnosing apparatus 100 includes a static field magnet 1, a gradient coil 2, an gradient power supply 3, a bed 4, a bed controller 5, RF coil units 6a, 6b and 6c, a transmitter 7, a selection circuit 8, a receiver 9 and a computer system 10.

The static field magnet 1 has a hollow cylindrical shape and generates a uniform static magnetic field in its inner space. As the static field magnet 1, a permanent magnet, a superconducting magnet or the like is employed.

The gradient coil 2 has a hollow cylindrical shape and is placed in an inner side of the static magnetic field magnet 1. The gradient coil 2 is a combination of three types of coils which correspond to X, Y and Z axes crossing normally with each other. As the above-mentioned three types of coils individually receive power supply from the gradient power supply 3, the gradient coil 2 generates such a gradient magnetic field that the magnetic intensity is changed along with each of the X, Y and Z axes. It should be noted here that the Z-axis is set in the same direction as that of, for example, the static magnetic field. The gradient magnetic fields of the X, Y and Z axes are assigned as, for example, a slice-selection gradient magnetic field Gs, a phase-encode gradient magnetic field Ge and a read-out gradient magnetic field Gr, respectively. The slice-selection gradient magnetic field Gs is used to arbitrarily determine a slice plane to be imaged. The phase-encode gradient magnetic field Ge is used to shift the phase of the magnetic resonance signal in accordance with the spatial position. The read-out gradient magnetic field Gr is used to change the frequency of the magnetic resonance signal in accordance with the spatial position.

A subject 200 is inserted to the cavity (imaging space) of the gradient coil 2 while it is placed on a top board 4a of the bed 4. The bed 4 is driven by the bed controller 5 such that the top board 4a is moved in its longitudinal direction (that is, the right-and-left in FIG. 1) and the up-and-down direction. Usually, the bed 4 is installed such that the longitudinal direction is set in parallel to the central axis of the static field magnet 1.

The RF coil unit 6a has such a structure that one or more coils are housed in a cylindrical case. The RF coil unit 6a is placed in an inner side of the gradient coil 2. Upon reception of a radio frequency pulse (RF pulse) supplied thereto, the RF coil unit 6a generates a radio frequency magnetic field.

The RF coil units 6b and 6c are placed on the top board 4a, or built in the top board 4a or mounted on the subject 200. As the RF coil units 6b and 6c, array coils are employed. In other words, the RF coil units 6b and 6c each include a plurality of elementary coils. Each of the elementary coils equipped in the RF coil units 6b and 6c receives the magnetic resonance signal radiated from the subject 200. Output signals from the elementary coils are individually input to the selection circuit 8. The signal-receiving RF coil units are not limited to the RF coil units 6b and 6c, but various types of coil units can be arbitrarily employed. Further, one or three or more signal-receiving RF coil units may be mounted.

The receiver 7 supplies an RF pulse corresponding to a Larmor frequency to the RF coil unit 6a.

The selection circuit 8 selects some of a plurality of magnetic resonance signals output from the RF coil units 6b and 6c. Then, the selection circuit 8 supplies the selected magnetic resonance signals to the receiver 9. A channel to be selected is instructed from the computer system 10.

The receiver 9 includes a plurality of channels of processing systems that further include amplifiers, phase detectors and analog-digital converters. To these channels of processing system, the magnetic resonance signals selected by the selection circuit 8 are supplied, respectively. The amplifier amplifies the magnetic resonance signals. The phase detector detects the phases of the magnetic resonance signals output from the amplifier. The analog-digital converter converts the signals output from the phase detector into digital signals. The receiver 9 outputs the digital signals obtained by each processing system.

The computer system 10 includes an interface 11, a data collection unit 12, a reconstruction unit 13, a memory 14, a display unit 15, an input unit 16 and a main controller 17.

To the interface 11, the gradient power supply 3, bed controller 5, transmitter 7, selection circuit 8, receiver 9, etc. are connected. The signals are input to and output from the interface 11, thus via which the signals transmitted and received between the computer system 10 and these members connected to the interface.

The data collection unit 12 collects the digital signals output from the receiver 9. The data collection unit 12 stores the collected digital signals, that is, magnetic resonance signal data, in the memory 14.

The reconstruction unit 13 executes a post-processing, more specifically, a reconstruction such as Fourier transform, on the magnetic resonance signal data stored in the memory 14, so as to acquire spectrum data of a desired nuclear spin in the subject 200, or image data thereof.

The memory 14 stores the magnetic resonance signal data, spectrum data or image data for each object.

The display unit 15 displays various types of data such as spectrum data and image data under the control of the main controller 17. As the display unit 15, a display device such as a liquid crystal display can be used.

The input unit 16 receives various types of commands and information entered by the operator. Usable examples of the input unit 16 can be selected from a pointing device such as a mouse or a track ball, a selector device such as a mode switch, and entry device such as a keyboard.

The main controller 17 includes a CPU, a memory, etc., and it comprehensively controls the magnetic resonance diagnosing apparatus 100. The main controller 17 has at least one of the function of determining a slice region for MRS in consideration of the imaging region in the multi slice imaging, and the function of determining a slicing location where a slice image is taken in consideration of the slice region for the MRS. Further, the main controller 17 has the function of generating an image that illustrates a slice image for a slice location and slice region which correspond to each other, and the MRS measurement result while associating them to each other.

As described above, the first to third embodiments involve magnetic resonance diagnosing apparatus 100 of a common structure. The difference between these embodiments resides in the operation of the magnetic resonance diagnosing apparatus 100, that is, the difference in processing by the main controller 17. The operation of the magnetic resonance diagnosing apparatus 100 in each of these embodiments will now be described in detail.

First Embodiment

FIG. 2 is a flowchart illustrating the processing steps of a main controller 17 shown in FIG. 1 in the first embodiment.

In step Sa1, the main controller 17 controls each member so as to carry out multi slice imaging by the MRI. The multi slice imaging is carried out by the conventional procedure, and in the final stage, a plurality of slice images are reconstructed by the reconstruction unit 13. It should be noted that the multi slice imaging may be either one of two-dimensional or three-dimensional type. In the two-dimensional imaging, the magnetic resonance signal data collected with regard to one slice are subjected to the two-dimensional Fourier transform when the reconstruction. In the three-dimensional imaging, the magnetic resonance signal data collected with regard to a plurality of slices are subjected to the three-dimensional Fourier transform when the reconstruction.

Figure 3:
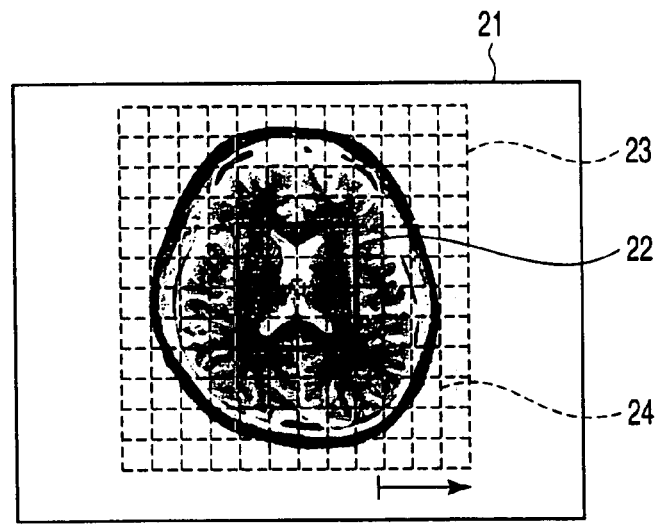
FIG. 3 is a diagram illustrating an example of the slice image to be displayed on a display unit shown in FIG. 1, which is used to determine an MRS region.

In step Sa2, the main controller 17 determines the region (to be called as "MRS region" hereinafter) in which the MRS measurement is carried out within the plane of a slice. More specifically, the main controller 17 displays one of the slice images obtained by the multi-slice imaging on the display unit 15. FIG. 3 shows an example of the slice image 21 to be displayed on the display unit 15. Which one of these slice images obtained by the multi-slice imaging is to be displayed can be determined, for example, based on a predetermined condition or selected by the user. The user manipulates the input unit 16 and designates for example, a region 22 such as shown in FIG. 3. Then, the main controller 17 determines the designated region as the MRS region.

Figure 4:
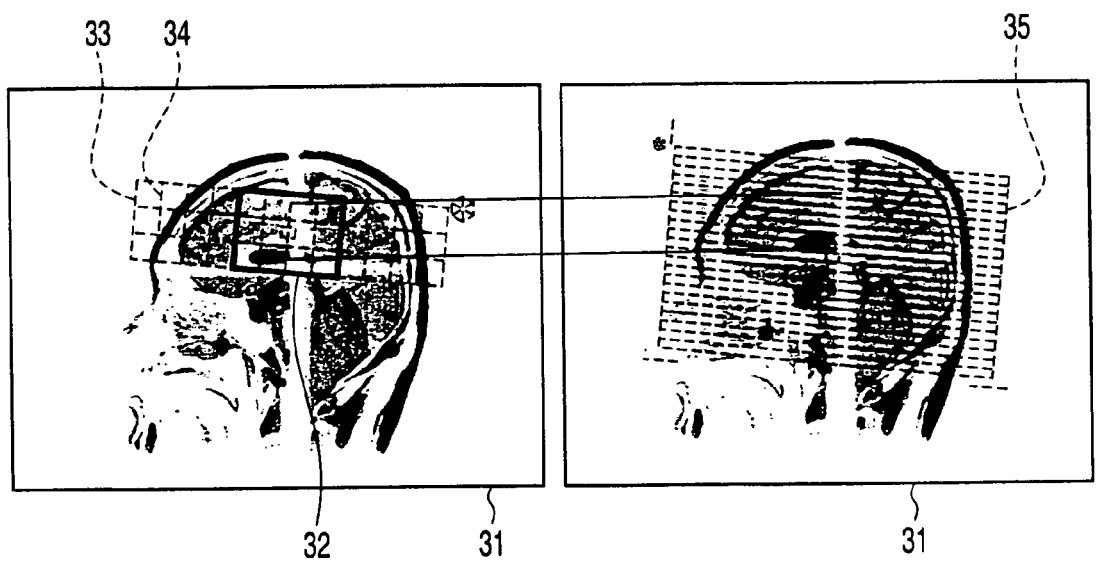
FIG. 4 is a diagram illustrating an example of the image to be displayed on the display unit shown in FIG. 1, which is used to determine a designated slice region.

In step Sa3, the main controller 17 determines the slice region designated by the user for the MRS measurement (the region to be called as "designated slice region" hereinafter). More specifically, the main controller 17 displays the image used when receiving the designation of the imaging region in the multi-slice imaging on the display unit 15. FIG. 4 shows an example of the image 31 to be displayed on the display unit 15 here. The user manipulates the input unit 16 and designates, for example, a region 32 such as shown in FIG. 4. Then, the main controller 17 determines the designated region as the designated slice region.

It should be noted here that frame 23 indicated by dashed lines in FIG. 3 and frame 33 indicated by dashed lines in FIG. 4 express the regions where the MR signals are collected for the MRS (the region to be called as "MRS collection region" hereinafter). Grid 24 indicated by dashed lines in FIG. 3 and grid 34 indicated by dashed lines in FIG. 4 express the boundaries of voxels for the MRS. An MRS collection region is determined based on the number of voxels in each of the vertical, lateral and depth directions, and the size of the voxels. It should be noted that the depth direction is the same as the slicing direction in the multi-slice imaging. The width of the voxels in the depth direction is set to an integer multiple of an interval between centers of adjacent slices in the multi-slice imaging.

In step Sa4, the main controller 17 moves the designated slice region so that the position of the depth-directional center of each voxel included in the designated slice region (the position to be called as "voxel center position" hereinafter) coincides with one of the slice positions in the multi slice imaging, with one condition that the amount of movement of the designated slice position is controlled as minimum as possible. For example, of the two voxels located at both ends of the designated slice region in which voxels are lined in the depth direction, the one closer to the end of the imaging region of the multi slice imaging is selected, and the designated slice region is moved so that the center position of the selected voxel coincides with the nearest slice position. Here, when the center position of each voxel coincides with its respective nearest slice position, the main controller 17 maintains the designated slice region at its location. In this manner, the center position of a voxel included in the designated slice region coincides with one of the slice positions as shown in FIG. 4. It should be noted that the frame denoted by reference numeral 35 in FIG. 4 is an example of the slice position in the multi slice imaging.

In step Sa5, the main controller 17 determines the designated slice position in the slice region for the MRS measurement after moving it in step Sa4.

In steps Sa6 and Sa7, the main controller 17 stands by for an instruction of changing the slice region or an instruction for executing the MRS. When the instruction of the change is entered by manipulating the input unit 16, the main controller 17 carries out steps Sa3 to Sa5 one more time to re-determine the slice region in accordance with the instruction of the change. On the other hand, when the instruction of the execution of the MRS is entered by manipulating the input unit 16, the main controller 17 proceeds its step from step Sa7 to Sa8.

In step Sa8, the main controller 17 measures the MR spectrum. More specifically, the main controller 17 controls each member to measure the MR spectrum of each of the voxels included in the region defined by the MRS region determined by step Sa2 and the slice region determined by step Sa5. The MR spectrum is measured by the conventionally known procedure, and in the final stage, the MR spectrum is obtained by the reconstruction unit 13. The measurement of the MR spectrum may be carried out by either one of two-dimensional MRS or three-dimensional MRS. In the two-dimensional MRS, the magnetic resonance signal data collected with regard to one or more slice are subjected to the three-dimensional Fourier transform when the MR spectrum is measure. In the three-dimensional MRS, the magnetic resonance signal data collected with regard to a plurality of slices are subjected to the four-dimensional Fourier transform when the MR spectrum is measured.

Figure 5:
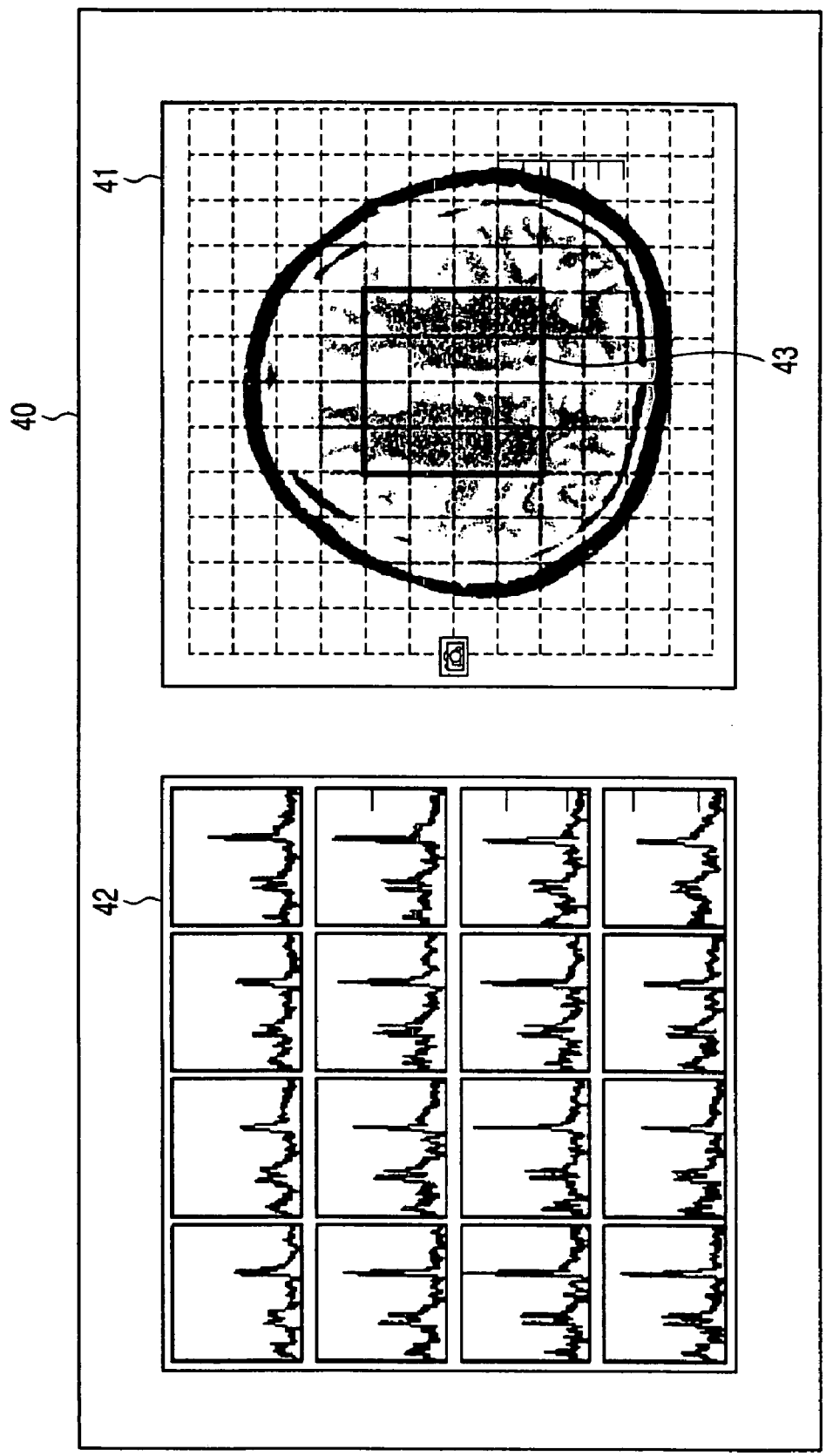
FIG. 5 is a diagram illustrating an example of the reference image to be displayed on the display unit shown in FIG. 1.

In step Sa9, the main controller 17 displays, for example, a reference image 40 on the display unit 15, in which a slice image obtained in step Sa1 and an MRS image 42 that indicates the MR spectrum obtained in step Sa8 are arranged side by side, as shown in FIG. 5. As described above, here, the voxel center position of each voxel for the MRS coincides with one of the slice positions, and therefore there is always a slice image corresponding to an MRS image at the same position in the slice direction for each one of the MRS images. Thus, the main controller 17 selects such images. It should be noted that the frame 43 that expresses the MRS region determined by step Sa2 is superimposed on the image 41. It can be seen from the example shown in FIG. 5 that 16 voxels are included in the MRS region in one slice. The image 42 shows 16 graphs illustrating MR spectra measured respectively for these sixteen voxels, which are disposed in the same arrangement as that of the voxels.

In this manner, the user can compare the slice image and MRS image at the same position in the slice direction at once by monitoring the reference image shown in FIG. 5, and therefore the user can carry out the diagnosis at a high efficiency.

Second Embodiment

Figure 6:
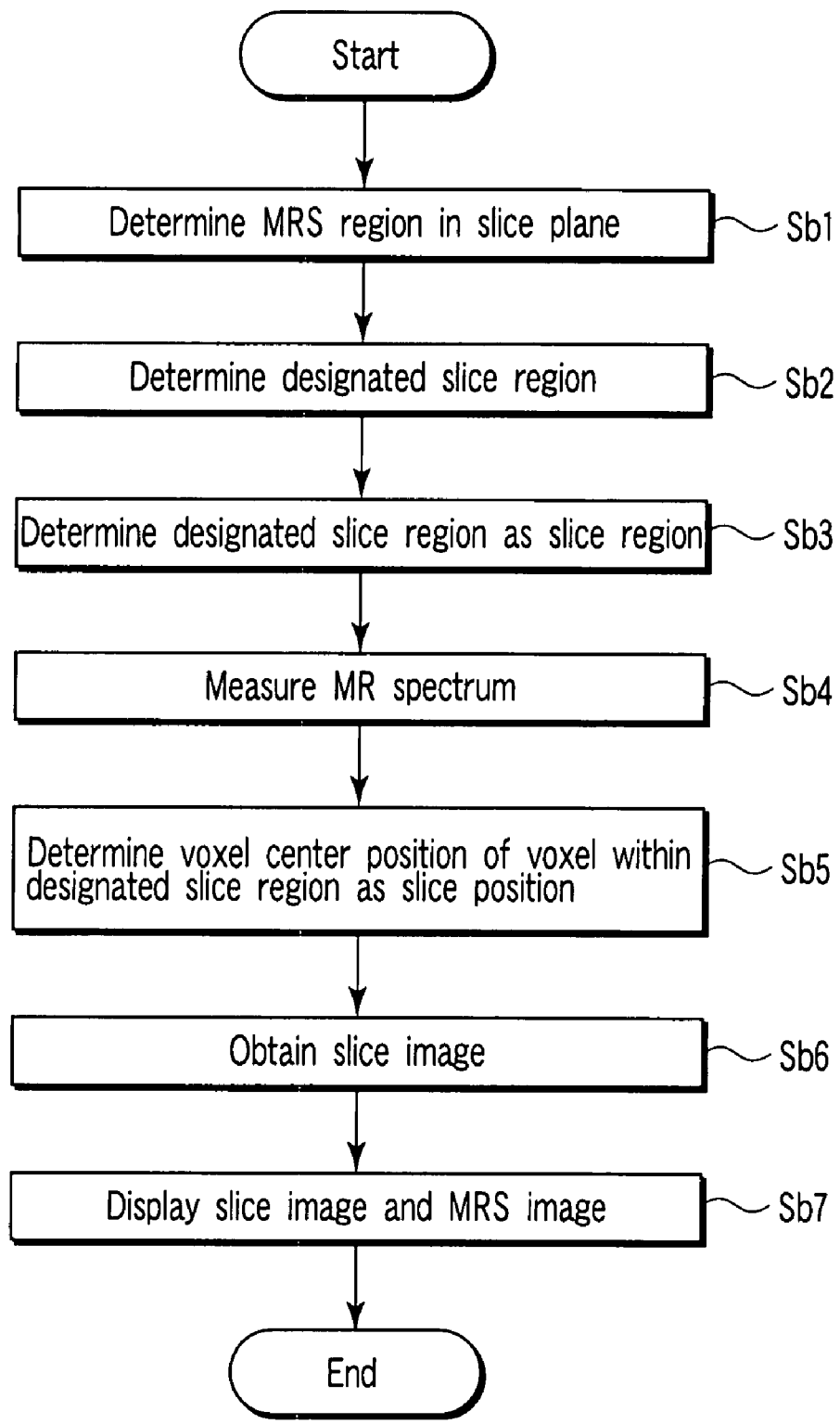
FIG. 6 is a flowchart illustrating the processing steps of the main controller shown in FIG. 1 in the second embodiment.

FIG. 6 is a flowchart illustrating the processing steps of the main controller 17 in the second embodiment.

In step Sb1, the main controller 17 determines the MRS region in the plane of a slice. More specifically, the main controller 17 determines the MRS region on a slice image obtained for the alignment in a similar manner to that of step Sa2 in the first embodiment.

In step Sb2, the main controller 17 determines the designated slice region in a similar manner to that of step Sa3 in the first embodiment.

In step Sb3, the main controller 17 determines the designated slice position determined in step Sb2 directly as the slice region for the MRS measurement.

In step Sb4, the main controller 17 measures the MR spectrum. More specifically, the main controller 17 measures the MR spectrum of each of the voxels included in the region defined by the MRS region determined by step Sb1 and the slice region determined by step Sb3.

In step Sb5, the main controller 17 determines the voxel center position of each of the voxels included in the designated slice region, as the slice position. When there is only one voxel in the depth direction within the designated slice region, one slice position is determined. On the other hand, when a plurality of voxels are arranged in the depth direction within the designated slice region, a plurality of slice positions are determined.

In step Sb6, the main controller 17 obtains the slice image for the slice position determined in step Sb5 by the MRI. It is also possible to obtain, as well, slice images for some other slice positions than that determined in step Sb5.

In step Sb7, the main controller 17 displays, for example, a reference image 40 on the display unit 15, in which a slice image 41 obtained in step Sb6 and an MRS image 42 that indicates the MR spectrum obtained in step Sb4 are arranged side by side, as shown in FIG. 5. As described above, here, the voxel center position of each voxel for the MRS coincides with one of the slice positions, and therefore there is always a slice image corresponding to an MRS image at the same position in the slice direction for each one of the MRS images. Thus, the main controller 17 selects such images.

In this manner, the user can compare the slice image and MRS image at the same position in the slice direction at once by monitoring the reference image shown in FIG. 5, and therefore the user can carry out the diagnosis at a high efficiency.

Third Embodiment

Figure 7:
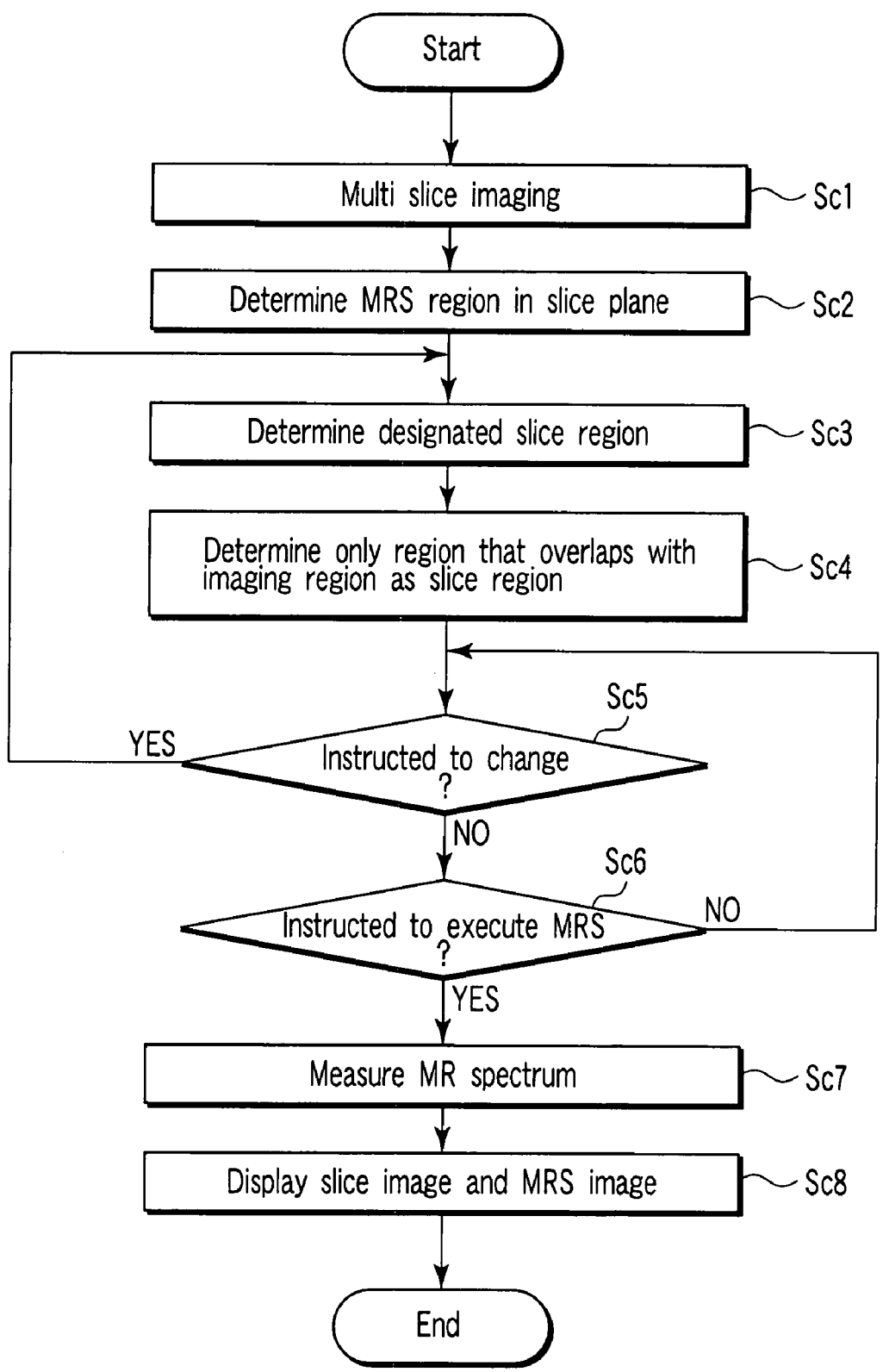
FIG. 7 is a flowchart illustrating the processing steps of the main controller shown in FIG. 1 in the third embodiment.

FIG. 7 is a flowchart illustrating the processing steps of the main controller 17 in the third embodiment.

In step Sc1, the main controller 17 carries out the multi slice imaging by the MRI. This multi slice imaging can be carried out by the conventionally known procedure.

In step Sc2, the main controller 17 determines the MRS region in a similar manner to that of step Sa2 in the first embodiment.

In step Sc3, the main controller 17 determines the designated slice region in a similar manner to that of step Sa3 in the first embodiment.

In step Sc4, the main controller 17 determines only the region of the designated slice region that overlaps with the imaging region of the multi slice imaging as the slice region for the MRS measurement.

In steps Sc5 and Sc6, the main controller 17 stands by for an instruction of changing the slice region or an instruction for executing the MRS. When the instruction of the change is entered by manipulating the input unit 16, the main controller 17 carries out steps Sc3 and Sc4 one more time to re-determine the slice region in accordance with the instruction of the change. On the other hand, when the instruction of the execution of the MRS is entered by manipulating the input unit 16, the main controller 17 proceeds its step from step Sc6 to Sc7.

In step Sc7, the main controller 17 measures the MR spectrum. More specifically, the main controller 17 measures the MR spectrum of each of the voxels included in the region defined by the MRS region determined by step Sc2 and the slice region determined by step Sc4.

In step Sc8, the main controller 17 displays, for example, a reference image on the display unit 15, in which a slice image 41 obtained in step Sc1 and an MRS image 42 that indicates the MR spectrum obtained in step Sc7 are arranged side by side, as shown in FIG. 5. Here, the third embodiment is different from the first or second embodiment in that the voxel center position of each of the voxels for the MRS and the slice position are determined regardless of each other. Therefore, the main controller 17 selects the slice image for the slice position nearest to the voxel center position of the voxel corresponding to the MRS image 42 and displays it. Here, in some cases, the slice image 41 and the MRS image 42 displace from each other in terms of the position in the slice direction. However, since the slice region of the MRS measurement is limited to the region that overlaps with the imaging region, the amount of the displacement is suppressed to ½ or less of the distance between the centers of adjacent slices in the multi slice imaging.

In this manner, the user can compare the slice image and MRS image at substantially the same position in the slice direction at once by monitoring the reference image shown in FIG. 5, and therefore the user can carry out the diagnosis at a high efficiency.

The above-provided embodiments can be modified into various versions as will now be described.

That is, in the first or second embodiment, the matching of the position of a voxel and that of a slice image may be performed with respect to a position other than the center position, for example, the edges of them.

The slice region may be determined automatically without an instruction from the user. For example, the slice region may be determined in a region of a certain ratio with respect to the imaging region of the multi slice imaging.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance diagnosing apparatus comprising:
    a generating unit which generates a plurality of MRI slice images of an object for an imaging region;
    a determining unit which determines a plurality of designated slice regions for MR spectroscopy (MRS) within the imaging region including the movement of a designated slice region as required to make an MRI slice image voxel position coincide with an MRI slice image position; and
    a measurement unit which measures a magnetic resonance spectrum of the object for each of voxels set on the plurality of designated slice regions still contained within said MRI slice imaging region.

2. The magnetic resonance diagnosing apparatus according to claim 1, wherein the determining unit determines the plurality of designated slice regions in accordance with an instruction from a user.

3. The magnetic resonance diagnosing apparatus according to claim 1, wherein the determining unit determines the plurality of designated slice regions such that positions of voxels included in the plurality of designated slice regions each coincide with a respectively corresponding MRI slice position of the plurality of MRI slice images.

4. The magnetic resonance diagnosing apparatus according to claim 3, wherein the determining unit determines the plurality of designated slice regions in accordance with an instruction from a user.

5. The magnetic resonance diagnosing apparatus according to claim 1, wherein the determining unit determines the plurality of designated slice regions such that center positions of voxels included in the plurality of designated slice regions each coincide with a respectively corresponding MRI slice center position of the plurality of MRI slice images.

6. The magnetic resonance diagnosing apparatus according to claim 1, further comprising:
    a generating unit which generates an image showing (a) one MRI slice image included in the plurality of MRI slice images and (b) the magnetic resonance spectrum measured with respect to each respectively corresponding voxel located at a respectively corresponding position with respect to a position of that one of the MRI slice images.

7. The magnetic resonance diagnosing apparatus according to claim 6, further comprising:
a generating unit which generates an image showing (a) one MRI slice image included in the plurality of MRI slice images and (b) the magnetic resonance spectrum measured with respect to each respectively corresponding voxel containing a respectively corresponding center position with respect to a center position of that one of the MRI slice images.

8. A magnetic resonance diagnosing apparatus comprising:
a determining unit which determines a plurality of MRS slice regions for spectroscopy;
a measurement unit which measures a magnetic resonance spectrum of an object for each of voxels set on the plurality of determined MRS slice regions; and
a generating unit which generates MRI slice images of the object with regard to each of a plurality of MRI slice positions that coincide with positions of the voxels in the plurality of MRS slice regions.

9. The magnetic resonance diagnosing apparatus according to claim 8, wherein:
the generating unit generates MRI slice images containing a slice center position which coincides with a center position of a respective one of the MRS voxels respectively.

10. The magnetic resonance diagnosing apparatus according to claim 8, further comprising:
a generating unit which generates an image showing the magnetic resonance spectrum and one MRI slice image included in the slice images respectively corresponding to the shown image.

11. A method of operating a magnetic resonance diagnosing apparatus, said method comprising:
generating a plurality of MRI slice images of an object for an imaging region;
determining a plurality of designated slice regions for MR spectroscopy (MRS) within the imaging region including the movement of a designated slice region as required to make an MRI slice image voxel position coincide with an MRI slice image position; and
measuring a magnetic resonance spectrum of the object for each of voxels set on the plurality of designated slice regions still contained within said MRI slice imaging region.

12. A method of operating a magnetic resonance diagnosing apparatus, said method comprising:
determining a plurality of MRS slice regions for spectroscopy;
measuring a magnetic resonance spectrum of an object for each of voxels set on the plurality of determined MRS slice regions; and
generating MRI slice images of the object with regard to each of a plurality of MRI slice positions that coincide with positions of the voxels in the plurality of MRS slice regions.

* * * * *